(12) United States Patent
Zhou et al.

(10) Patent No.: US 11,355,291 B2
(45) Date of Patent: *Jun. 7, 2022

(54) FUSIBLE SAFETY DISCONNECT IN SOLID STATE CIRCUIT BREAKERS AND COMBINATION MOTOR STARTERS

(71) Applicant: EATON INTELLIGENT POWER LIMITED, Dublin (IE)

(72) Inventors: Xin Zhou, Wexford, PA (US); Brian E. Carlson, Gibsonia, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 167 days.

This patent is subject to a terminal disclaimer.

(21) Appl. No.: 16/817,878

(22) Filed: Mar. 13, 2020

(65) Prior Publication Data

US 2020/0219679 A1 Jul. 9, 2020

Related U.S. Application Data

(63) Continuation of application No. 15/849,716, filed on Dec. 21, 2017, now Pat. No. 10,629,391.

(51) Int. Cl.
*H01H 9/54* (2006.01)
*H01H 89/00* (2006.01)
(Continued)

(52) U.S. Cl.
CPC .............. *H01H 9/547* (2013.01); *H01H 1/42* (2013.01); *H01H 9/548* (2013.01); *H01H 33/596* (2013.01); *H01H 71/122* (2013.01); *H01H 71/24* (2013.01); *H01H 77/102* (2013.01); *H01H 85/041* (2013.01); *H01H 89/00* (2013.01); *H03K 17/60* (2013.01); *H01H 9/10* (2013.01); *H01H 9/38* (2013.01); *H01H 71/46* (2013.01); *H01H 2085/0283* (2013.01); *H01H 2235/01* (2013.01)

(58) Field of Classification Search
CPC .......... H01H 1/42; H01H 9/574; H01H 9/584; H01H 9/38; H01H 9/10; H01H 33/596; H01H 71/24; H01H 71/122; H01H 71/46; H01H 77/102; H01H 85/041; H01H 89/00; H01H 2085/0283; H01H 2235/01; H03K 17/08116; H03K 17/60; H03K 2017/0806
USPC ........................................................ 361/115
See application file for complete search history.

(56) References Cited

U.S. PATENT DOCUMENTS 4,618,906 A 10/1986 Paice et al.
5,936,495 A 8/1999 Lecourt
(Continued)

FOREIGN PATENT DOCUMENTS

DE 1186138 B 1/1965
KR 200 439 685 Y1 4/2008

OTHER PUBLICATIONS

Machine Translation of Fehling German Patent Document DE 1186138 B Jan. 28, 1965 (Year: 1965).*

(Continued)

*Primary Examiner* — Kevin J Comber
(74) *Attorney, Agent, or Firm* — Eckert Seamans Cherin & Mellott, LLC (57) ABSTRACT

An isolation disconnect assembly for an insulated gate bipolar transistor assembly is provided. The isolation disconnect assembly includes a conductor assembly and a clinch joint magnetic actuator.

10 Claims, 8 Drawing Sheets

(51) Int. Cl.
  *H01H 85/041*  (2006.01)
  *H01H 71/12*   (2006.01)
  *H03K 17/60*   (2006.01)
  *H01H 71/24*   (2006.01)
  *H01H 33/59*   (2006.01)
  *H01H 77/10*   (2006.01)
  *H01H 1/42*    (2006.01)
  *H01H 9/38*        (2006.01)
  *H01H 85/02*       (2006.01)
  *H01H 9/10*        (2006.01)
  *H01H 71/46*       (2006.01)

(56) References Cited

U.S. PATENT DOCUMENTS

| | | |
|---|---|---|
| 8,416,541 B1 | 4/2013 | White |
| 2008/0310062 A1 | 12/2008 | Kumfer |
| 2012/0007657 A1 | 1/2012 | Naumann et al. |
| 2012/0099236 A1 | 4/2012 | Cyuzawa et al. |
| 2012/0277846 A1 | 11/2012 | Schreck et al. |
| 2014/0168830 A1 | 6/2014 | Vangool et al. |
| 2015/0222111 A1 | 8/2015 | Magnusson et al. |
| 2016/0322184 A1 | 11/2016 | Schmitz et al. |
| 2017/0092454 A1 | 3/2017 | Kozar et al. |
| 2017/0098931 A1 | 4/2017 | Gerdinand et al. |
| 2017/0358403 A1 | 12/2017 | Zhou |

OTHER PUBLICATIONS

European Patent Office, "International Search Report and Written Opinion", Corresp. PCT/EP2018/025328, dated Mar. 19, 2019, 18 pp.

European Patent Office, "extended European search report" for corresponding EP Patent Appl. No. EP 20 16 6900, dated Aug. 4, 2020, 10 pp.

* cited by examiner

FUSIBLE SAFETY DISCONNECT IN SOLID STATE CIRCUIT BREAKERS AND COMBINATION MOTOR STARTERS

CROSS-REFERENCE TO RELATED APPLICATIONS

This application is a continuation of, and claims priority from, U.S. patent application Ser. No. 15/849,716, filed Dec. 21, 2017, entitled "FUSIBLE SAFETY DISCONNECT IN SOLID STATE CIRCUIT BREAKERS AND COMBINATION MOTOR STARTERS", the contents of which are incorporated herein by reference.

BACKGROUND OF THE INVENTION

Field of the Invention

The disclosed and claimed concept relates to a solid state circuit breaker, a hybrid solid state circuit breaker or other solid state switching devices with an isolation disconnect assembly that is structured to interrupt a current following a failure of power electronic components in the solid state circuit breaker or the hybrid solid state circuit breaker.

Background Information

For a solid state circuit breaker, a hybrid solid state circuit breaker or a solid state switching device, there is a potential risk that the power electronic switching component such as, but not limited to, an Insulated Gate Bipolar Transistor circuit assembly ("IGBT circuit assembly") can fail during a short circuit event. In some instances, the power electronic switching component will fail while shorted. Further, there is a possibility that a DC bus inside the solid state circuit breaker will be shorted. This will result a high current short circuit event. A typical isolation switch or disconnect inside a solid state switching device cannot provide needed short circuit interruption capability. This is a problem in that a short circuit hazard is created. This is a stated problem.

Such a short circuit hazard needs to be mitigated rapidly. There is a further need for an isolation disconnect assembly for a solid state circuit breaker that is compatible with existing hardware.

SUMMARY OF THE INVENTION

These needs, and others, are met by at least one embodiment of this invention which provides an isolation disconnect assembly for a power electronic switching device such as an insulated gate bipolar transistor assembly. The insulated gate bipolar transistor assembly includes a conductor assembly. The insulated gate bipolar transistor assembly conductor assembly includes a line conductor. The insulated gate bipolar transistor assembly has a first tripping current. The isolation disconnect assembly includes a conductor assembly and a clinch joint magnetic actuator. The isolation disconnect conductor assembly includes a line conductor assembly, a load conductor assembly and a control assembly. The line conductor assembly includes a stationary conductor, a clinch joint and a fuse. The load conductor assembly includes a movable conductor. The clinch joint magnetic actuator is operatively coupled to the load conductor assembly movable conductor and structured to move the load conductor assembly movable conductor between an open, first position, wherein the load conductor assembly movable conductor is not in electrical communication with the line conductor assembly stationary conductor, and, a closed second position, wherein the load conductor assembly movable conductor is in electrical communication with the line conductor assembly stationary conductor. The control assembly is in operative communication with the clinch joint magnetic actuator. The control assembly is structured to operatively communicate with the clinch joint magnetic actuator upon detection of the first tripping current. Further, when the isolation disconnect assembly is exposed to a second tripping current that is equal to or higher than the first tripping current, the isolation disconnect assembly is structured to interrupt the current via the fuse. Further, in one embodiment, the movable conductor is "blown open," as defined below, when exposed to the second tripping current.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

It will be appreciated that the specific elements illustrated in the figures herein and described in the following specification are simply exemplary embodiments of the disclosed concept, which are provided as non-limiting examples solely for the purpose of illustration. Therefore, specific dimensions, orientations, assembly, number of components used, embodiment configurations and other physical characteristics related to the embodiments disclosed herein are not to be considered limiting on the scope of the disclosed concept.

Directional phrases used herein, such as, for example, clockwise, counterclockwise, left, right, top, bottom, upwards, downwards and derivatives thereof, relate to the orientation of the elements shown in the drawings and are not limiting upon the claims unless expressly recited therein.

As used herein, the singular form of "a," "an," and "the" include plural references unless the context clearly dictates otherwise.

As used herein, "structured to [verb]" means that the identified element or assembly has a structure that is shaped, sized, disposed, coupled and/or configured to perform the identified verb. For example, a member that is "structured to move" is movably coupled to another element and includes elements that cause the member to move or the member is otherwise configured to move in response to other elements or assemblies. As such, as used herein, "structured to [verb]" recites structure and not function. Further, as used herein, "structured to [verb]" means that the identified element or assembly is intended to, and is designed to, perform the identified verb. Thus, an element that is merely capable of performing the identified verb but which is not intended to, and is not designed to, perform the identified verb is not "structured to [verb]."

As used herein, "associated" means that the elements are part of the same assembly and/or operate together, or, act upon/with each other in some manner. For example, an automobile has four tires and four hub caps. While all the elements are coupled as part of the automobile, it is understood that each hubcap is "associated" with a specific tire.

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other. Accordingly, when two elements are coupled, all portions of those elements are coupled. A description, however, of a specific portion of a first element being coupled to a second element, e.g., an axle first end being coupled to a first wheel, means that the specific portion of the first element is disposed closer to the second element than the other portions thereof. Further, an object resting on another object held in place only by gravity is not "coupled" to the lower object unless the upper object is otherwise maintained substantially in place. That is, for example, a book on a table is not coupled thereto, but a book glued to a table is coupled thereto.

As used herein, a "fastener" is a separate component structured to couple two or more elements. Thus, for example, a bolt is a "fastener" but a tongue-and-groove coupling is not a "fastener." That is, the tongue-and-groove elements are part of the elements being coupled and are not a separate component.

As used herein, the phrase "removably coupled" means that one component is coupled with another component in an essentially temporary manner. That is, the two components are coupled in such a way that the joining or separation of the components is easy and would not damage the components. For example, two components secured to each other with a limited number of readily accessible fasteners, i.e., fasteners that are not difficult to access, are "removably coupled" whereas two components that are welded together or joined by difficult to access fasteners are not "removably coupled." A "difficult to access fastener" is one that requires the removal of one or more other components prior to accessing the fastener wherein the "other component" is not an access device such as, but not limited to, a door.

As used herein, "operatively coupled" means that a number of elements or assemblies, each of which is movable between a first position and a second position, or a first configuration and a second configuration, are coupled so that as the first element moves from one position/configuration to the other, the second element moves between positions/configurations as well. It is noted that a first element may be "operatively coupled" to another without the opposite being true.

As used herein, a "coupling assembly" includes two or more couplings or coupling components. The components of a coupling or coupling assembly are generally not part of the same element or other component. As such, the components of a "coupling assembly" may not be described at the same time in the following description.

As used herein, a "coupling" or "coupling component(s)" is one or more component(s) of a coupling assembly. That is, a coupling assembly includes at least two components that are structured to be coupled together. It is understood that the components of a coupling assembly are compatible with each other. For example, in a coupling assembly, if one coupling component is a snap socket, the other coupling component is a snap plug, or, if one coupling component is a bolt, then the other coupling component is a nut.

As used herein, "correspond" indicates that two structural components are sized and shaped to be similar to each other and may be coupled with a minimum amount of friction. Thus, an opening which "corresponds" to a member is sized slightly larger than the member so that the member may pass through the opening with a minimum amount of friction. This definition is modified if the two components are to fit "snugly" together. In that situation, the difference between the size of the components is even smaller whereby the amount of friction increases. If the element defining the opening and/or the component inserted into the opening are made from a deformable or compressible material, the opening may even be slightly smaller than the component being inserted into the opening. With regard to surfaces, shapes, and lines, two, or more, "corresponding" surfaces, shapes, or lines have generally the same size, shape, and contours.

As used herein, a "path of travel" or "path," when used in association with an element that moves, includes the space an element moves through when in motion. As such, any element that moves inherently has a "path of travel" or "path." When used in association with an electrical current, a "path" includes the elements through which the current travels.

As used herein, the statement that two or more parts or components "engage" one another shall mean that the elements exert a force or bias against one another either directly or through one or more intermediate elements or components. Further, as used herein with regard to moving parts, a moving part may "engage" another element during the motion from one position to another and/or may "engage" another element once in the described position. Thus, it is understood that the statements, "when element A moves to element A first position, element A engages element B," and "when element A is in element A first position, element A engages element B" are equivalent statements and mean that element A either engages element B while moving to element A first position and/or element A either engages element B while in element A first position.

As used herein, "operatively engage" means "engage and move." That is, "operatively engage" when used in relation to a first component that is structured to move a movable or rotatable second component means that the first component applies a force sufficient to cause the second component to move. For example, a screwdriver may be placed into contact with a screw. When no force is applied to the screwdriver, the screwdriver is merely "coupled" to the screw. If an axial force is applied to the screwdriver, the screwdriver is pressed against the screw and "engages" the screw. However, when a rotational force is applied to the screwdriver, the screwdriver "operatively engages" the screw and causes the screw to rotate. Further, with electronic components, "operatively engage" means that one component controls another component by a control signal or current.

As used herein, the word "unitary" means a component that is created as a single piece or unit. That is, a component that includes pieces that are created separately and then coupled together as a unit is not a "unitary" component or body.

As used herein, the term "number" shall mean one or an integer greater than one (i.e., a plurality).

As used herein, in the phrase "[x] moves between its first position and second position," or, "[y] is structured to move [x] between its first position and second position," "[x]" is the name of an element or assembly. Further, when [x] is an element or assembly that moves between a number of positions, the pronoun "its" means "[x]," i.e., the named element or assembly that precedes the pronoun "its."

As used herein, when elements are in "electrical communication" a current may flow between the elements. That is, when a current is present and elements are in "electrical communication," then the current flows between the elements. It is understood that elements that are in "electrical communication" are either directly coupled or have a number of conductive elements, or other constructs, disposed therebetween creating the path for the current.

As used herein, a "clinch joint" is a coupling wherein two conductive elements engage each other so that electromagnetic forces generated at the interface of the conductive members cannot separate the conductive elements up to a predefined high current value. A clinch joint inherently includes a clevis (a first coupling component) and a generally planar lug (a second coupling component) wherein the clevis is a yoke that has tines disposed on either side of the lug. The lug is movably disposed relative to the yoke and is structured to, and does, move between a first position, wherein the lug is not disposed between, coupled to, or in electrical communication with, the tines of the yoke, and, a second position, wherein the lug is disposed between, coupled to, and is in electrical communication with, the tines of the yoke. It is understood that the clevis and the lug may be described as elements of different assemblies but both are also elements of the "clinch joint."

As used herein, "about" in a phrase such as "disposed about [an element, point or axis]" or "extend about [an element, point or axis]" or "[X] degrees about an [an element, point or axis]," means encircle, extend around, or measured around. When used in reference to a measurement or in a similar manner, "about" means "approximately," i.e., in an approximate range relevant to the measurement as would be understood by one of ordinary skill in the art.

As used herein, "generally" means "in a general manner" relevant to the term being modified as would be understood by one of ordinary skill in the art.

As used herein, "substantially" means "for the most part" relevant to the term being modified as would be understood by one of ordinary skill in the art.

As used herein, "at" means on and/or near relevant to the term being modified as would be understood by one of ordinary skill in the art.

Figure 1:
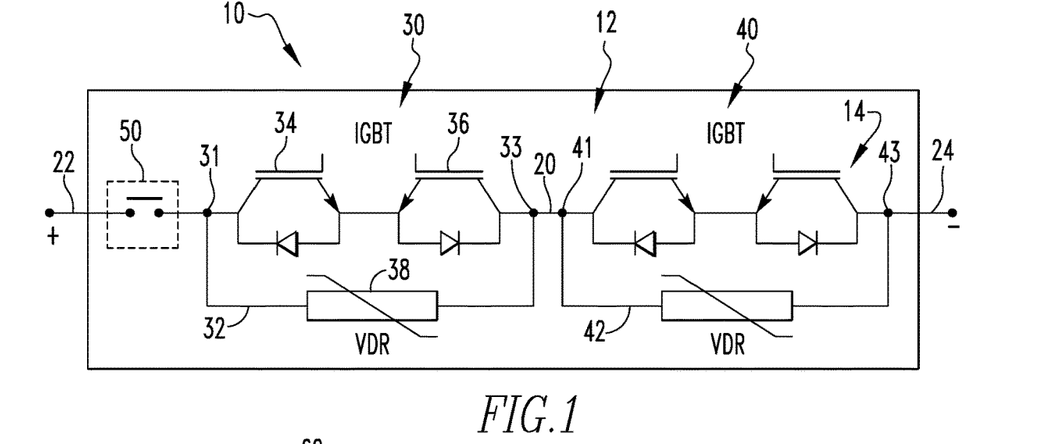
FIG. 1 is a schematic view of an insulated gate bipolar transistor assembly with an isolation disconnect assembly.

As shown in FIG. 1, a power electronic switching device 10 includes a power electronic switching component 12 such as, but not limited to, an Insulated Gate Bipolar Transistor (hereinafter "IGBT") circuit assembly 14 as well as an isolation disconnect assembly 50. The IGBT circuit assembly 14 has a first tripping current.

In an exemplary embodiment, an IGBT circuit assembly 14 includes a conductor assembly 20, a first IGBT circuit 30 and a second IGBT circuit 40. The IGBT circuits 30, 40 are substantially similar and only one will be described in detail. Generally, elements of the first IGBT circuit 30 are identified by reference numbers in the "30s" and elements of the second IGBT circuit 40 are identified by reference numbers in the "40s." After the first IGBT circuit 30 is described in detail, it is understood that similar elements of the second IGBT circuit 40 will be identified by the similar names but are identified by a reference number that is ten digits higher. For example, the first IGBT circuit 30 includes a first IGBT circuit conductor assembly first terminal 31 while the second IGBT circuit 40 includes a second IGBT circuit conductor assembly first terminal 41, both discussed below. Further, each IGBT circuit 30, 40 includes a conductor assembly 32, 42, and selected elements thereof are also identified as part of the IGBT circuit assembly conductor assembly 20.

The first IGBT circuit 30 includes a conductor assembly 32, a first IGBT 34 and second IGBT 36 and a voltage dependent resistor 38. The first IGBT circuit conductor assembly 32 includes a first terminal 31 and a second terminal 33. The first IGBT circuit conductor assembly 32 couples, i.e., provides electrical communication between, the first IGBT circuit first IGBT 34 and the first IGBT circuit second IGBT 36 in such a manner that, by controlling the first IGBT circuit first IGBT 34 and the first IGBT circuit second IGBT 36, the current can flow bi-directionally. The first IGBT circuit conductor assembly 32 further couples the first IGBT circuit voltage dependent resistor 38 in parallel to the combination of the first IGBT circuit first IGBT 34 and the first IGBT circuit second IGBT 36. The first IGBT circuit conductor assembly first terminal 31 is structured to be, and is, coupled to and in electrical communication with an electrical component outside the first IGBT circuit 30 as well as outside the IGBT circuit assembly 14; accordingly, the first IGBT circuit conductor assembly first terminal 31 is also identified as the IGBT circuit assembly first terminal 31. The first IGBT circuit conductor assembly second terminal 33 is structured to be, and is, coupled to and in electrical communication with the second IGBT circuit 40. That is, the first IGBT circuit conductor assembly second terminal 33 is structured to be, and is, coupled to and in electrical communication with the second IGBT circuit conductor assembly first terminal 41. Further, the second IGBT circuit conductor assembly second terminal 43 is structured to be, and is, coupled to and in electrical communication with an electrical component outside the second IGBT circuit 40 as well as outside the IGBT circuit assembly 14; accordingly, the second IGBT circuit conductor assembly second terminal 43 is also identified as the IGBT circuit assembly second terminal 43.

The IGBT circuit assembly conductor assembly 20 further includes a line conductor 22 and a load conductor 24. In an exemplary embodiment, the IGBT circuit assembly conductor assembly line conductor 22 is structured to be, and is, coupled to and in electrical communication with the IGBT circuit assembly first terminal 31, i.e., the first IGBT circuit conductor assembly first terminal 31. The IGBT circuit assembly conductor assembly load conductor 24 is structured to be, and is, coupled to and in electrical communication with the IGBT circuit assembly second terminal 33, i.e., the second IGBT circuit conductor assembly second terminal 33. In an exemplary embodiment, the isolation disconnect assembly 50 is structured to be, and is, coupled to and in electrical communication with the IGBT circuit assembly conductor assembly line conductor 22.

The isolation disconnect assembly 50 is structured to interrupt a current on the line side of the IGBT circuit assembly 14. This solves the problems noted above. In an exemplary embodiment, the isolation disconnect assembly 50 is structured to interrupt a current in less than about 3 ms. This solves the problems noted above. The isolation disconnect assembly 50 includes a conductor assembly 60, a clinch joint magnetic actuator 70 and a control assembly 80.

As shown in FIGS. 2-6, the isolation disconnect assembly conductor assembly 60 is disposed on the line side of the IGBT circuit assembly 14 includes a line conductor assembly 90, a load conductor assembly 100 and a clinch joint 62. It is understood that the isolation disconnect assembly conductor assembly 60 is, in another embodiment (not shown) disposed on the load side of the IGBT circuit assembly 14. In such an embodiment, the isolation disconnect assembly conductor assembly 60 operates in substantially the same manner as described below. It is understood that in the alternate configuration, selected adjectives used below, such as "line" and/or "load" are different and/or reversed. The elements of the clinch joint 62 are also identified as elements of the line conductor assembly 90 and the load conductor assembly 100, as described below. The isolation disconnect assembly conductor assembly line conductor assembly 90 (hereinafter "line conductor assembly" 90) includes a stationary conductor 92, a clinch joint clevis 94 and a fuse 96. The isolation disconnect assembly conductor assembly load conductor assembly 100 (hereinafter "load conductor assembly" 100) includes a movable conductor 102. That is, the clinch joint 62 includes the clinch joint clevis 94, which is a yoke having two spaced tines (not numbered), and the movable conductor 102 which is the clinch joint lug. Further, the stationary conductor 92 is structured to be, and is, coupled to, and in electrical communication with, the clinch joint clevis 94. Thus, an element that is coupled to, and in electrical communication with, the clinch joint clevis 94 is also coupled to, and in electrical communication with, the stationary conductor 92. The fuse 96 is structured to, and does, interrupt the current, i.e., is structured to fuse, when the current is at or above a second tripping current, discussed below. In an exemplary embodiment, the fuse 96 is structured to, and does, have a fusing speed of between about 0.5 ms to about 1.5 ms, or about 1 ms. The stationary conductor 92 is structured to be, and is, coupled to, and in electrical communication with, a line (not numbered) carrying a current. The load conductor assembly movable conductor 102 is structured to be, and is, coupled to, and in electrical communication with, the IGBT circuit assembly 14. As shown, and in an exemplary embodiment, the load conductor assembly movable conductor 102 is coupled to, and in electrical communication with, the IGBT circuit assembly first terminal 31. Thus, the isolation disconnect assembly 50 is disposed on the line side of the IGBT circuit assembly 14.

The clinch joint magnetic actuator 70 is structured to be, and is, operatively coupled to the load conductor assembly movable conductor 102. In this configuration, the clinch joint magnetic actuator 70 is structured to move the load conductor assembly movable conductor 102 between an open, first position (FIGS. 2 and 5), wherein the load conductor assembly movable conductor 102 is not in electrical communication with the line conductor assembly stationary conductor 92, and, a closed second position (FIGS. 3 and 6), wherein the load conductor assembly movable conductor 102 is in electrical communication with the line conductor assembly stationary conductor 92. That is, when the load conductor assembly movable conductor 102 is in the first position, the load conductor assembly movable conductor 102 is spaced from the clinch joint clevis 94. Conversely, when the load conductor assembly movable conductor 102 is in the second position, the load conductor assembly movable conductor 102 is coupled to, and in electrical communication with, the clinch joint clevis 94.

The clinch joint magnetic actuator 70 includes an output shaft 72, a housing 74 and a magnetic drive assembly (not shown). The magnetic drive assembly is structured to move the output shaft 72 between a retracted position, wherein the output shaft 72 is generally disposed inside the housing 74, and, a second position, wherein the output shaft 72 is generally disposed outside the housing 74. In an exemplary embodiment, the magnetic drive assembly is structured to move the output shaft 72 between the first and second positions in about 0.003 seconds, or between about 0.0025 seconds and 0.0035 seconds.

The control assembly 80 is in operative communication with said clinch joint magnetic actuator 70. As used herein, "operative communication" means that a control assembly is coupled to an actuator and is structured to communicate a control signal that causes the actuator to actuate. In this exemplary embodiment, the clinch joint magnetic actuator 70 is the actuator and the control assembly 80 is structured to, and does, send a control signal that causes the clinch joint magnetic actuator 70 to move the output shaft 72 between the first and second positions. The control assembly 80 is also structured to be manually controlled. That is, the control assembly 80 is structured to accept a manual input that causes the clinch joint magnetic actuator 70 to move the output shaft 72 between the first and second positions.

The control assembly 80 also includes, or is coupled to, a trip unit (not shown) or similar assembly that is structured to, and does, detect the current in the power electronic switching device 10 and/or any subcomponent thereof. Conversely, the clinch joint 62 is structured so that the load conductor assembly movable conductor 102 "blows open" at the second tripping current. That is, the magnetic force at the contact interface generated by the current and Lorentz force due to the current through the line conductor assembly 90 and the load conductor assembly 100; when this force is sufficient to overcome any force maintaining the load conductor assembly movable conductor 102 in the second position, the load conductor assembly movable conductor 102 moves to the first position. Accordingly, the control assembly 80 is structured to, and does, operatively communicate with the clinch joint magnetic actuator 70 upon detection of a second tripping current, and wherein, the second tripping current is equal to or higher than the first tripping current. In an exemplary embodiment, the second tripping current is slightly higher than the first tripping current. As used herein, "slightly higher" means that the second tripping current is equal to or less than 5% higher than the first tripping current.

Figure 2:
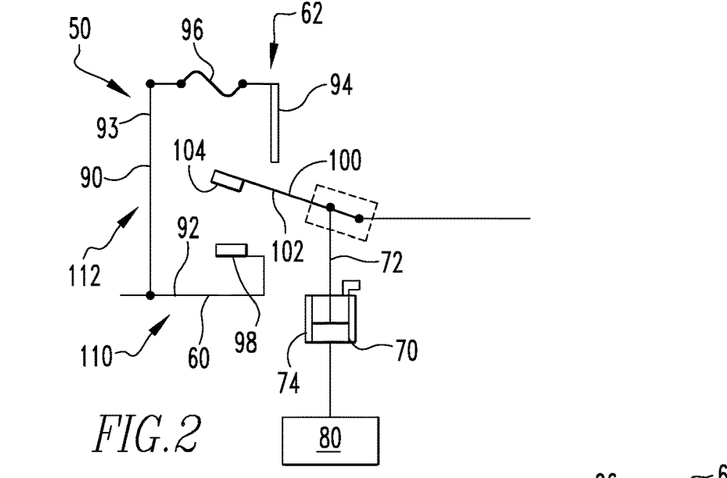
FIG. 2 is a schematic view of one embodiment of an isolation disconnect assembly with a movable conductor in a first position.
Figure 3:
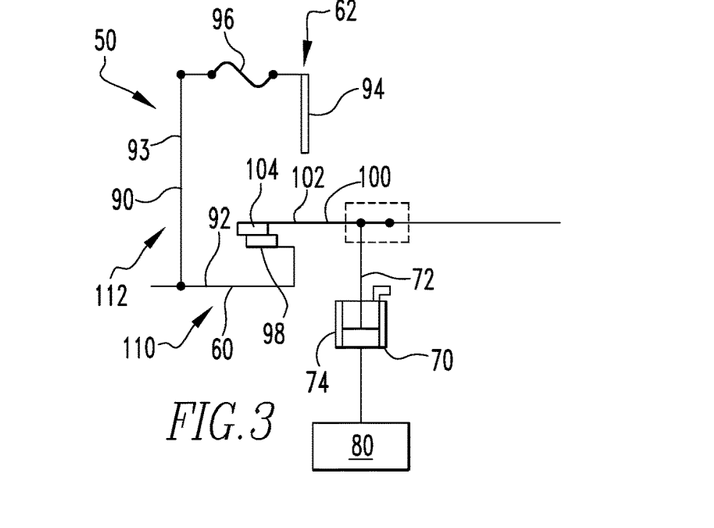
FIG. 3 is a schematic view of one embodiment of an isolation disconnect assembly with a movable conductor in a second position.
Figure 4:
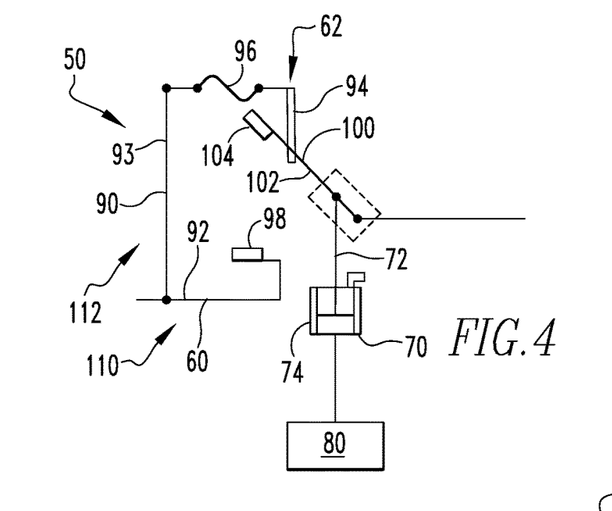
FIG. 4 is a schematic view of one embodiment of an isolation disconnect assembly with a movable conductor in a disconnect second position.

In an exemplary embodiment, shown in FIGS. 2-4, the line conductor assembly 90 includes a first current path 110 and a second current path 112. In this embodiment, the first current path 110 includes a stationary contact 98 and the stationary conductor 92. That is, the stationary contact 98 is coupled, directly coupled, or stationary, and in electrical communication with, the stationary conductor 92. The second current path 112 includes a secondary stationary conductor 93 as well as the clinch joint clevis 94 and the fuse 96. The fuse 96 is coupled to, and is in electrical communication with, both the secondary stationary conductor 93 and the clinch joint clevis 94. That is, the fuse 96 is disposed between the secondary stationary conductor 93 and the clinch joint clevis 94. As shown in FIG. 3, the second current path 112 is disposed adjacent the first current path 110. Thus, the clinch joint clevis 94 and the fuse 96 are disposed adjacent the stationary conductor 92 and the stationary contact 98.

Further, in this embodiment, the load conductor assembly 100 includes a movable contact 104 that is coupled, directly coupled, or stationary, and in electrical communication with, the movable conductor 102. The movable contact 104 moves with the movable conductor 102 and is structured to, and does, move between a first position, wherein the movable contact 104 is spaced from the stationary contact 98, and, a second position, wherein the movable contact 104 is coupled to, and in electrical communication with, the stationary contact 98. Further, in this embodiment, and during the normal operation of the power electronic switching device 10, the movable conductor 102 and the movable contact 104 are in the second position, also identified herein as the "operating second position" (FIG. 3), wherein the movable contact 104 is coupled to, and in electrical communication with, the stationary contact 98 while being spaced from the clinch joint clevis 94.

Further, in this embodiment, the movable conductor 102 and the movable contact 104 are structured to, and do, move to a disconnect second position wherein the movable conductor 102 and the movable contact 104 are spaced from the stationary conductor 92 and the stationary contact 98, respectively, and wherein the movable conductor 102 is coupled to, and in electrical communication with, the clinch joint clevis 94. That is, the movable conductor 102 and the movable contact 104 are movable between three positions; an operating second position, wherein the movable contact 104 is coupled to, and in electrical communication with, the stationary contact 98 while being spaced from the clinch joint clevis 94, a first position, wherein the movable conductor 102 is spaced from both the stationary conductor 92 and the clinch joint clevis 94 (and wherein the movable contact 104 is spaced from the stationary contact 98), and a disconnect second position (FIG. 4) wherein the movable conductor 102 is directly coupled to, and in electrical communication with, the clinch joint clevis 94.

In this configuration, the movable conductor 102 is structured to be in the operating second position during normal operation, and, to be in the disconnect second position during a short circuit event. Further, when the movable conductor 102 is in the operating second position and directly coupled to the stationary contact 98 which, as used herein, is when the movable contact 104 is directly coupled to the stationary contact 98, current passes through the first current path 110. When the movable conductor 102 is in the disconnect second position, the movable conductor 102 is directly coupled to the clinch joint clevis 94 and current passes through the second current path. Thus, when the movable conductor 102 is in the disconnect second position, current passes through the fuse 96.

Further, in this embodiment, the isolation disconnect assembly conductor assembly 60 is structured to move the movable conductor 102 from the operating second position and the disconnect second position using the magnetic force (also identified herein as the "blow open" force) generated by the short circuit current in the elements of the isolation disconnect assembly conductor assembly 60 when a second tripping current is present. That is, when a second tripping current is present, the movable conductor 102 blows open. In an exemplary embodiment, the blow open speed, i.e., the time it takes the movable conductor 102 to move from the operating second position to the disconnect second position is between about 1 ms and 2 ms, or about 1.5 ms. Further, in an exemplary embodiment, the load conductor assembly 100 includes a blow open cam assembly 120.

As used herein, a "blow open cam assembly" means an assembly including a cam surface and a cam follower wherein the cam follower moves over the cam surface, wherein the cam surface is biased toward the cam follower, wherein the bias applied by the cam surface creates a contact force that generally maintains the cam follower in a selected orientation relative to the cam surface, and wherein, upon exposure to a sudden force (such as but not limited to a "blow open" force), the cam follower overcomes the bias applied by the cam surface and moves over the cam surface. In an exemplary embodiment, shown in FIGS. 7A-9D, the load conductor assembly movable conductor 102 is an assembly including an elongated conductor member 114 with a proximal, first end 116 and a distal, second end 118. The movable contact 104 is coupled, directly coupled, or fixed to the load conductor assembly movable conductor member second end 118 (hereinafter "load conductor member second end" 118). Further, the load conductor assembly movable conductor member first end 116 (hereinafter "load conductor member first end" 116) defines a cam follower 122 of the blow open cam assembly 120.

Figure 7A:
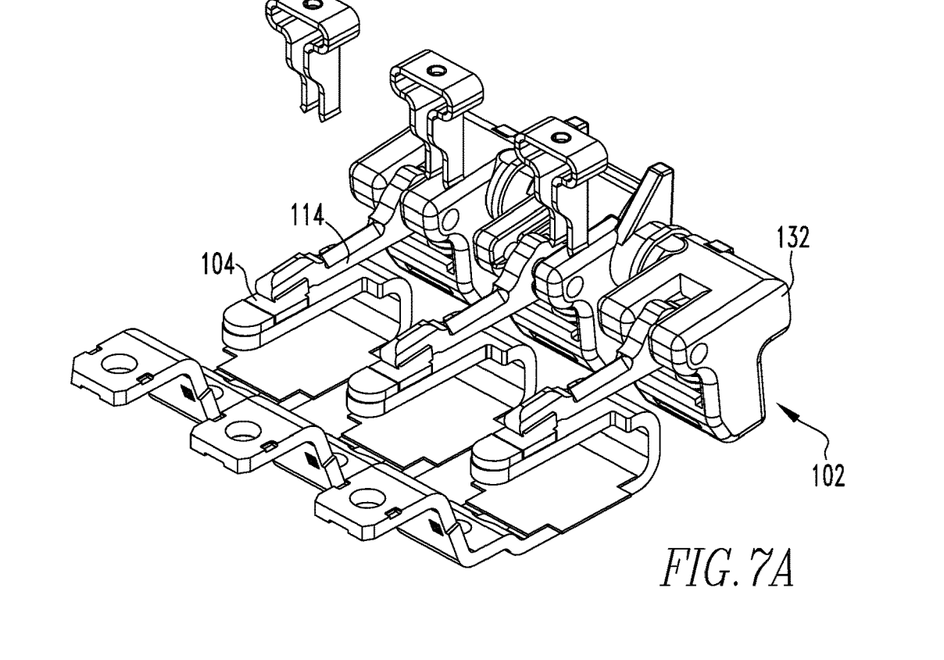
FIG. 7A is a first isometric view of a blow open cam assembly in a first configuration with the load conductor assembly movable conductor in the second position.
Figure 7B:
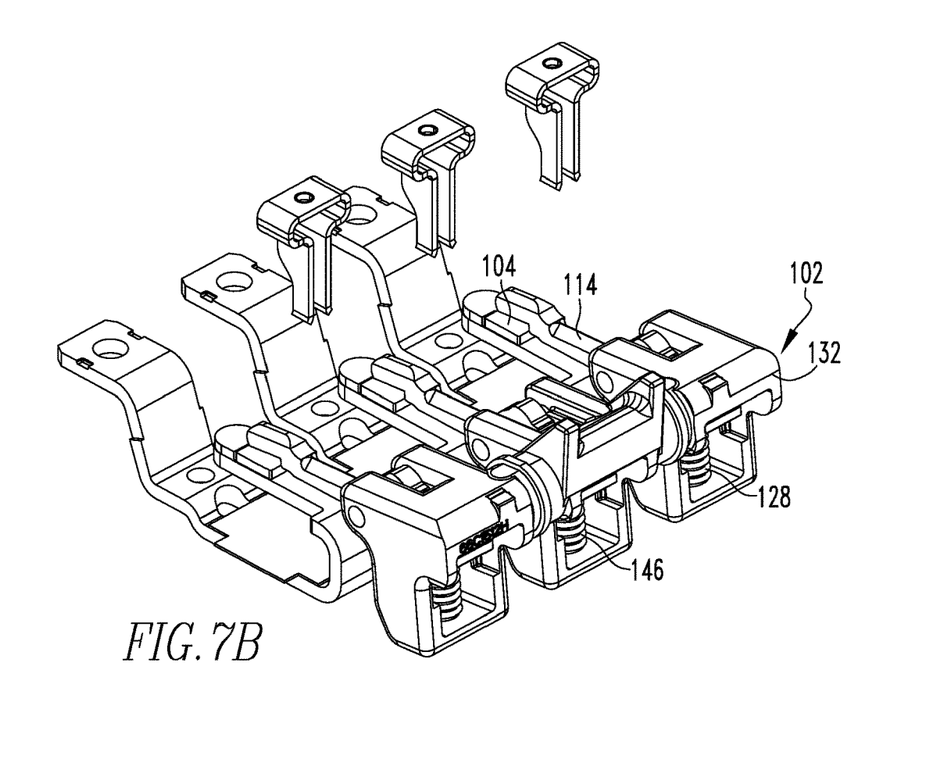
FIG. 7B is a second isometric view of a blow open cam assembly in a first configuration with the load conductor assembly movable conductor in the second position.
Figure 7C:
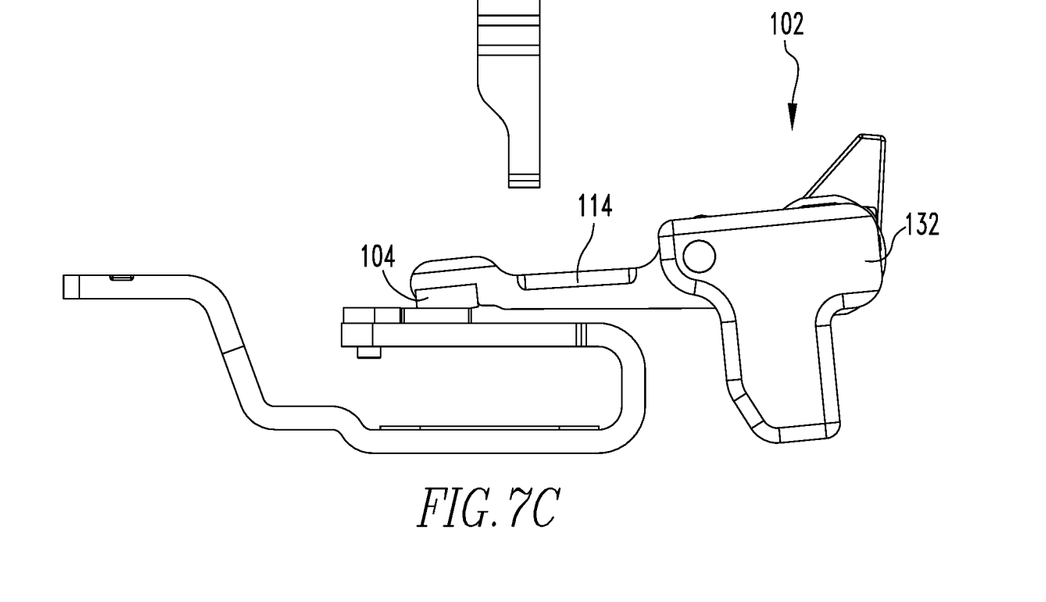
FIG. 7C is a side view of a blow open cam assembly in a first configuration with the load conductor assembly movable conductor in the second position.
Figure 7D:
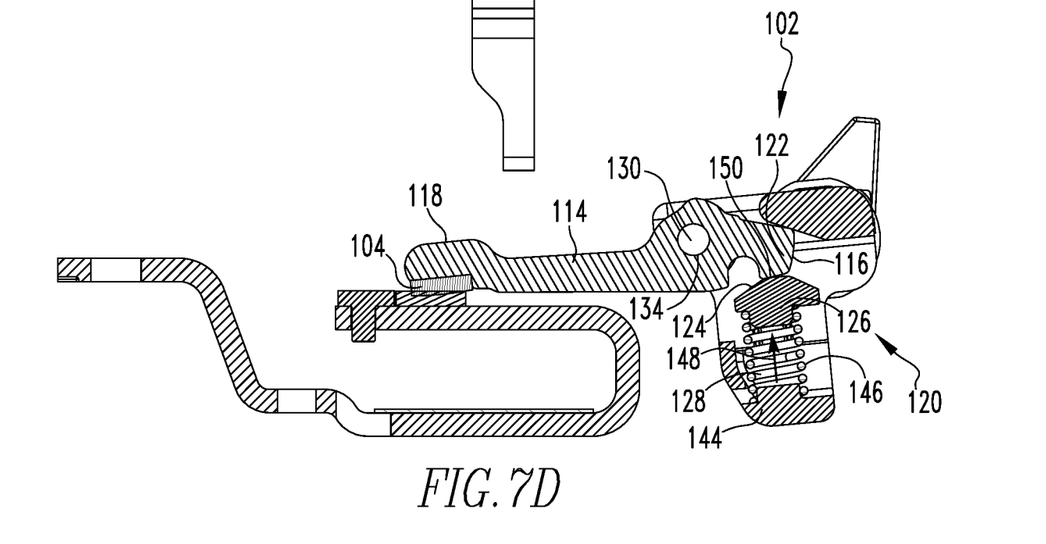
FIG. 7D is a cross-sectional side view of a blow open cam assembly in a first configuration with the load conductor assembly movable conductor in the second position.
Figure 8A:
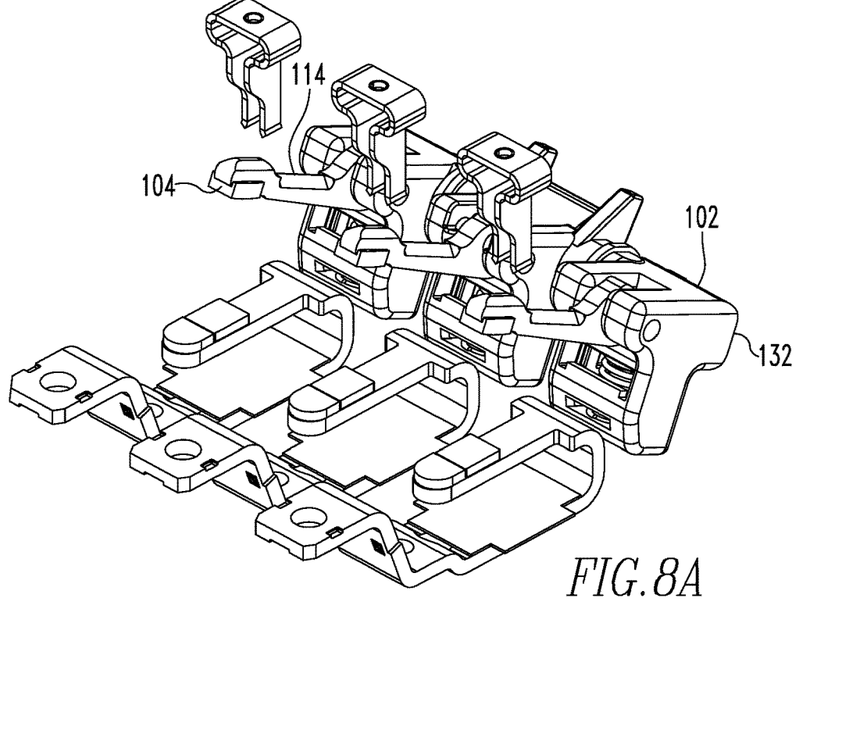
FIG. 8A is a first isometric view of a blow open cam assembly in a first configuration with the load conductor assembly movable conductor in the first position.
Figure 8B:
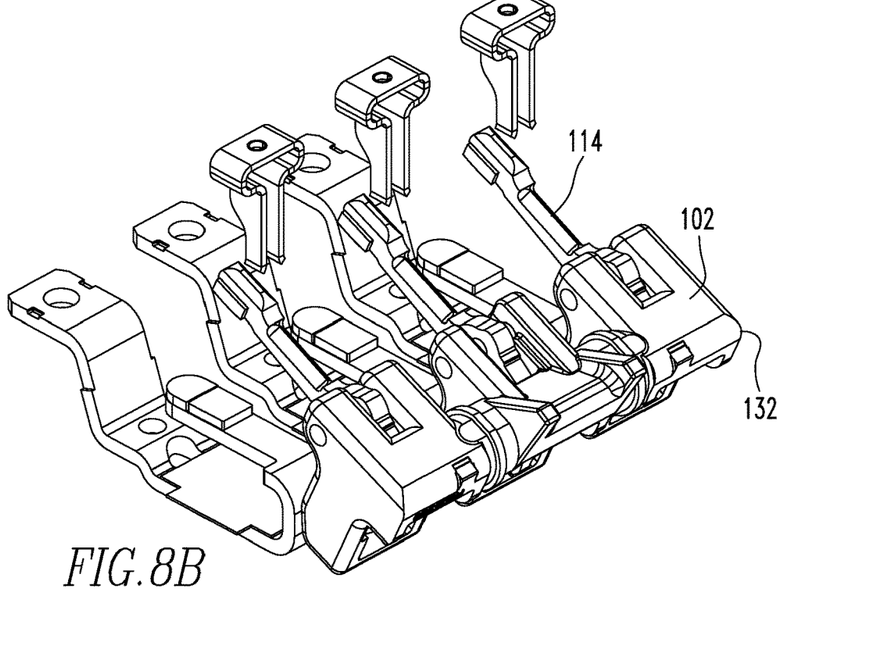
FIG. 8B is a second isometric view of a blow open cam assembly in a first configuration with the load conductor assembly movable conductor in the first position.
Figure 8C:
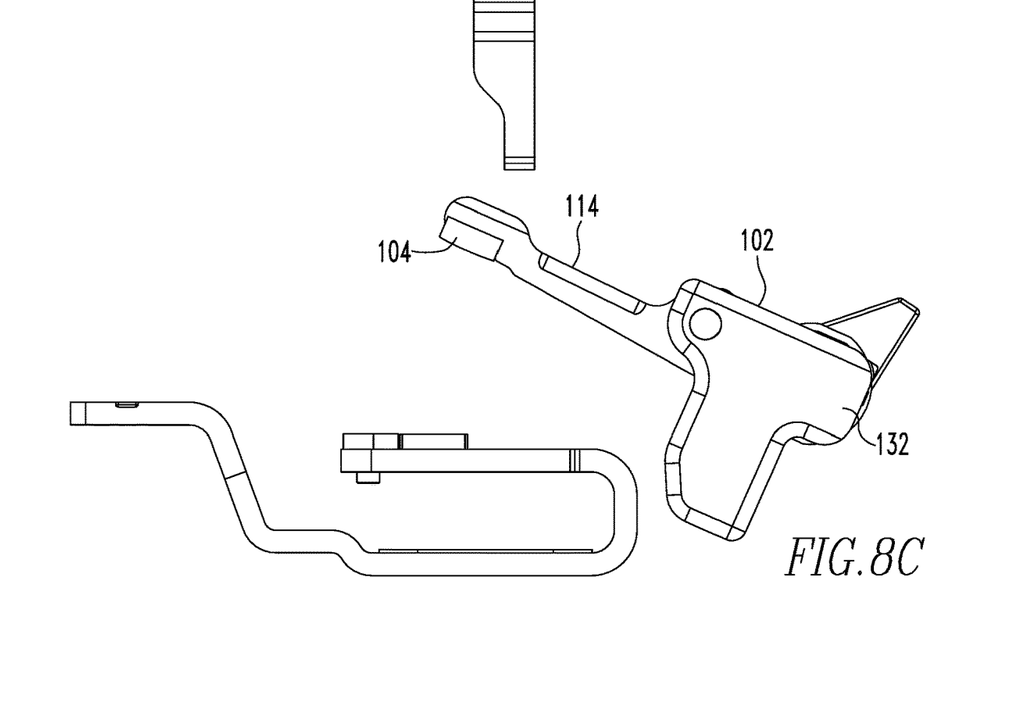
FIG. 8C is a side view of a blow open cam assembly in a first configuration with the load conductor assembly movable conductor in the first position.
Figure 8D:
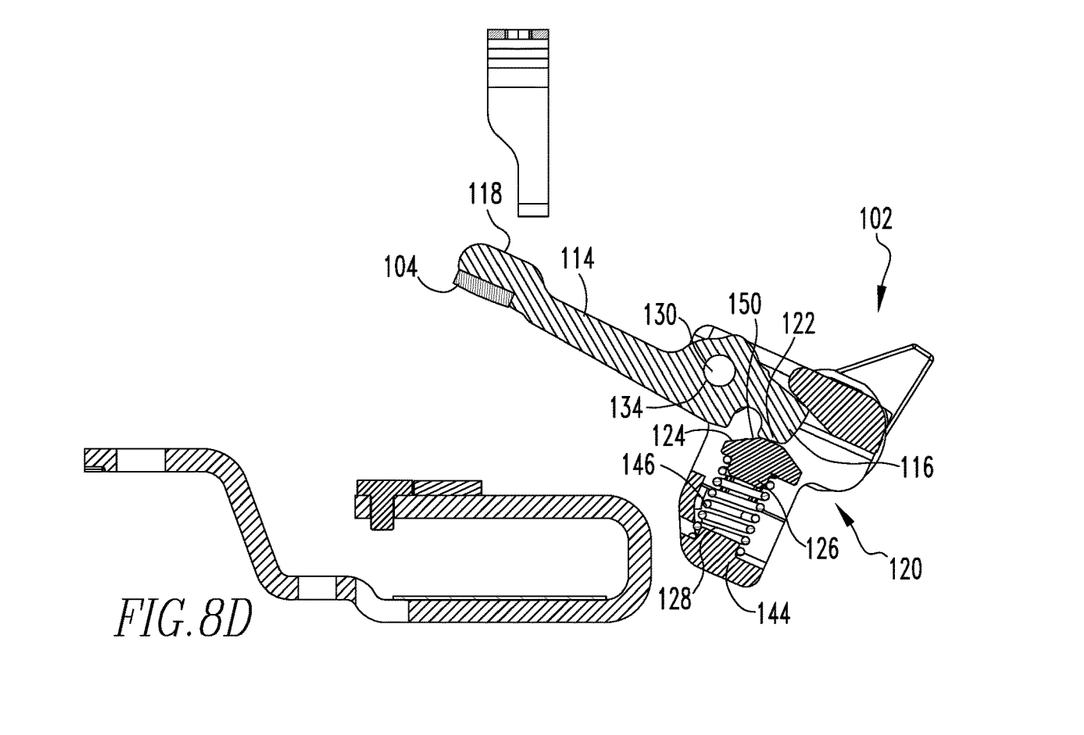
FIG. 8D is a cross-sectional side view of a blow open cam assembly in a first configuration with the load conductor assembly movable conductor in the first position.

That is, the blow open cam assembly 120 includes a cam follower 122, a cam surface 124 (defined in this embodiment by a cam member 126) a bias device 128, and a pivot coupling 130. As shown, and in an exemplary embodiment, the blow open cam assembly pivot coupling 130 is defined by a housing 132 that generally encloses portions of the blow open cam assembly 120. The load conductor assembly movable conductor member 114 is pivotally coupled to the blow open cam assembly pivot coupling 130. The load conductor assembly movable conductor member 114 includes a pivot coupling, shown as a generally circular opening 134, disposed between the load conductor member first end 116 and the load conductor member second end 118. In an exemplary embodiment, the blow open cam assembly pivot coupling 130 is disposed closer to the load conductor member first end 116 than the load conductor member second end 118. Thus, relative to the blow open cam assembly housing 132, the load conductor assembly movable conductor member 114 moves between a first configuration relative to the blow open cam assembly housing 132 and a second configuration wherein the configuration relative to the blow open cam assembly housing 132. That is, as shown in FIG. 7D, in the first configuration the longitudinal axis of the load conductor assembly movable conductor member 114 extends generally perpendicular to a line of force 148 generated by the blow open cam assembly bias device 128. In the second configuration, the longitudinal axis of the load conductor assembly movable conductor member 114 extends at a generally acute angle relative to a line of force 148 generated by the blow open cam assembly bias device 128. As used herein a "generally acute" angle means less than eighty degrees, and, "generally perpendicular" means within, and including, ten degrees of a right angle.

The blow open cam assembly housing 132, in an exemplary embodiment, also defines a mounting 144 for the blow open cam assembly bias device 128. In an exemplary embodiment, the blow open cam assembly bias device 128 is a spring 146 that generates a bias as represented by a line of force 148. The blow open cam assembly cam member 126 is supported by the blow open cam assembly bias device 128 and biased toward the load conductor member first end 116, i.e., toward the blow open cam assembly cam follower 122. The blow open cam assembly cam member 126 engages the blow open cam assembly cam follower 122 and biases the load conductor assembly movable conductor member 114 to the first configuration. This is the operational, i.e., the normal configuration, of the load conductor assembly movable conductor member 114. The load conductor assembly movable conductor member 114 is maintained in this configuration when the load conductor assembly movable conductor 102 moves between the first and second positions. That is, when the load conductor assembly movable conductor 102 is actuated by the clinch joint magnetic actuator 70, the load conductor assembly movable conductor member 114 is maintained in the first configuration. Conversely, when the load conductor assembly movable conductor 102 "blows open" at the second tripping current, the load conductor assembly movable conductor 102 moves from the first to the second configuration.

Figure 9A:
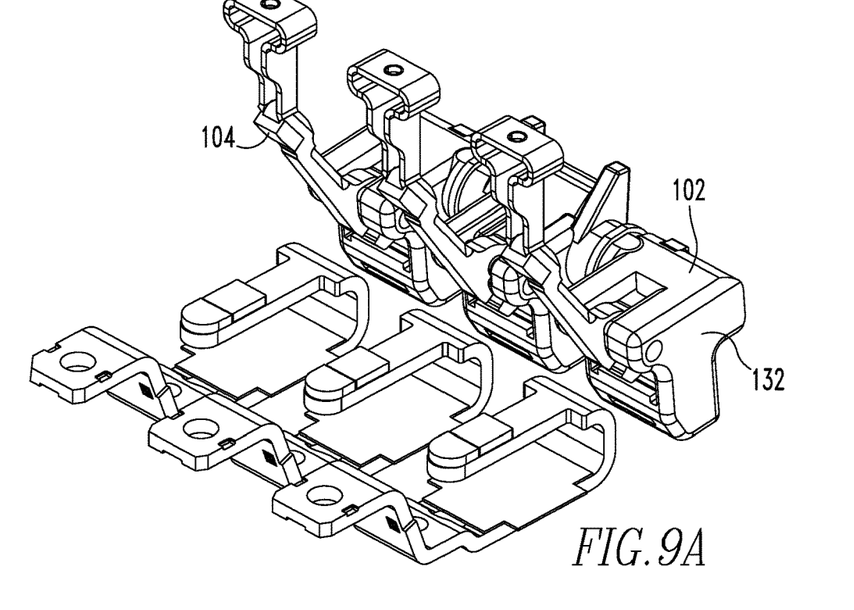
FIG. 9A is a first isometric view of a blow open cam assembly in a second configuration with the load conductor assembly movable conductor in the second position.
Figure 9B:
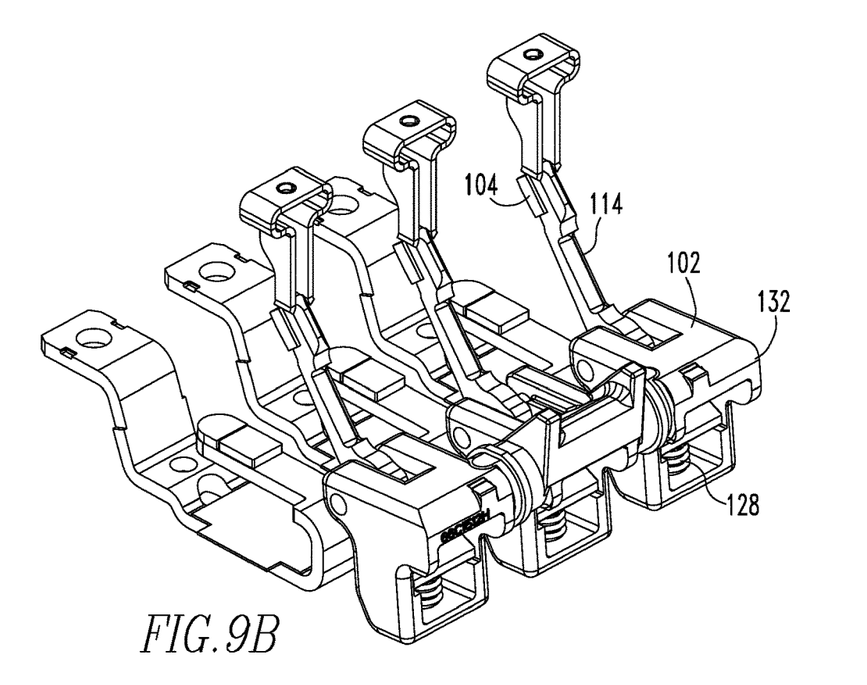
FIG. 9B is a second isometric view of a blow open cam assembly in a second configuration with the load conductor assembly movable conductor in the second position.
Figure 9C:
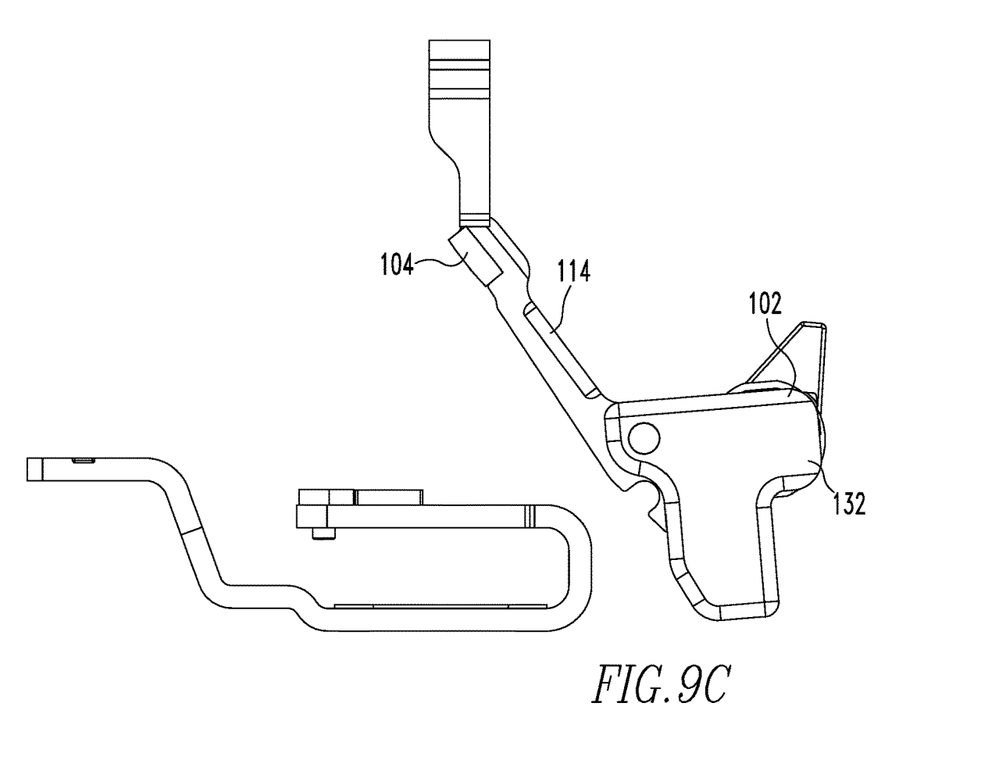
FIG. 9C is a side view of a blow open cam assembly in a second configuration with the load conductor assembly movable conductor in the second position.
Figure 9D:
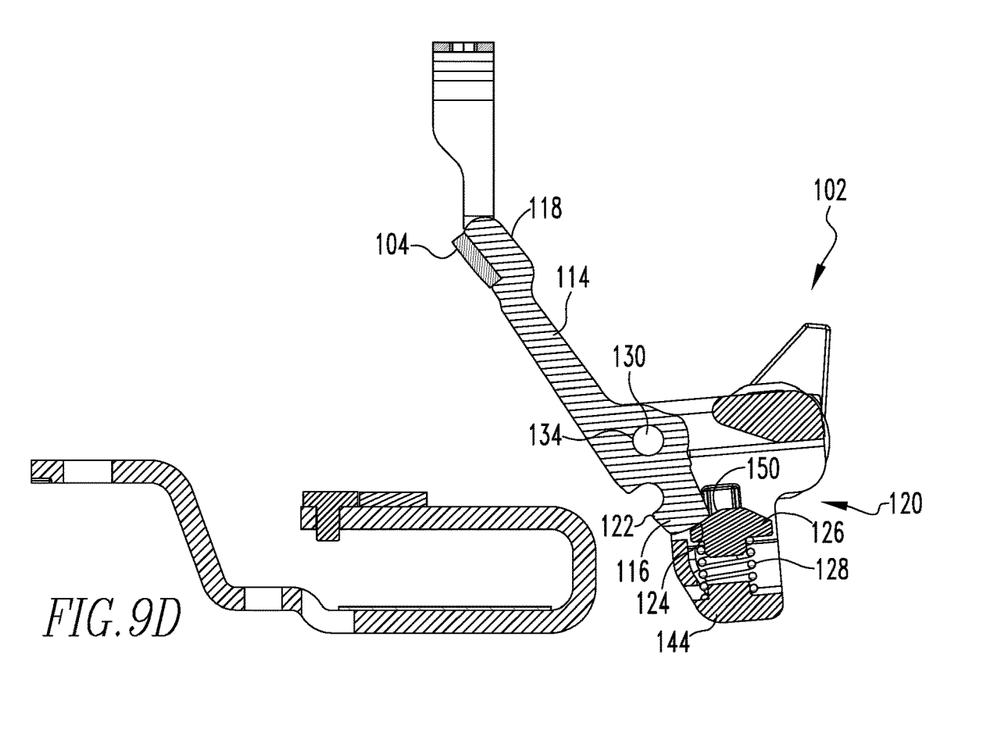
FIG. 9D is a cross-sectional side view of a blow open cam assembly in a second configuration with the load conductor assembly movable conductor in the second position.

This is accomplished, in part, by the shape of the blow open cam assembly cam follower 122 and the blow open cam assembly cam surface 124. That is, the interface between blow open cam assembly cam follower 122 and the blow open cam assembly cam surface 124 is structured so that the bias created by the blow open cam assembly bias device 128 maintains the load conductor assembly movable conductor member 114 in the first configuration, but where the blow open forces overcome the bias of the blow open cam assembly bias device 128 and causes the load conductor assembly movable conductor member 114 to move into the second configuration. In an exemplary embodiment, the blow open cam assembly cam follower 122 is generally a straight surface when viewed in cross-section, as shown in FIG. 9D. The blow open cam assembly cam surface 124, in this embodiment, defines a "knee" 150 which, as used herein, means an angled intersection of two generally planar surfaces when viewed in cross section, as shown in FIG. 9D. It is understood that this is an exemplary embodiment and the characteristics of the blow open cam assembly cam follower 122 and the blow open cam assembly cam surface 124, such as, but not limited to, the length of the blow open cam assembly cam follower 122 and the angle of the knee 150, can be varied so as to select the second tripping current. Further, in an exemplary embodiment, the shape of the knee 150 also resists the movement of the load conductor assembly movable conductor member 114 from the second configuration to the first configuration.

In an exemplary embodiment, the movable conductor 102 blows open without assistance from the clinch joint magnetic actuator 70. In another exemplary embodiment, when a second tripping current is present, the clinch joint magnetic actuator 70 sends a control signal that causes the clinch joint magnetic actuator 70 to move the output shaft 72 between the first and second positions. That is, the clinch joint magnetic actuator 70 assists in moving the movable conductor 102 from the operating second position to the disconnect second position. Further, in this embodiment, the clinch joint magnetic actuator 70 is structured to, and does, independently move the movable conductor 102 between the first position and the operating second position.

Thus, in this embodiment, when a second tripping current is present, the movable conductor 102 moves from the operating second position to the disconnect second position. At this point, the current passes through the second current path 112 which includes the fuse 96. When the fuse 96 is exposed to the second tripping current, the fuse 96 fuses thereby interrupting the current.

Figure 5:
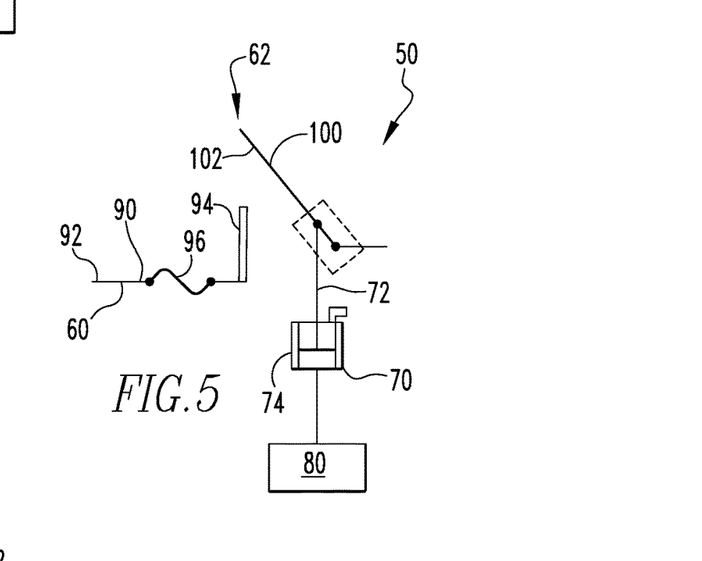
FIG. 5 is a schematic view of another embodiment of an isolation disconnect assembly with a movable conductor in a first position.
Figure 6:
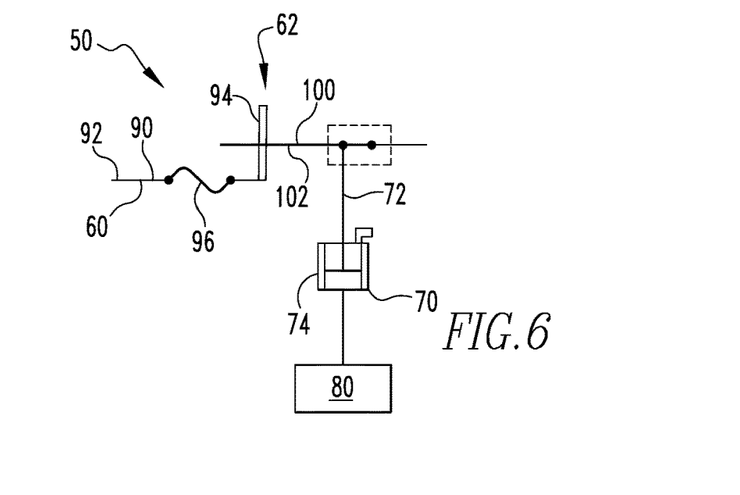
FIG. 6 is a schematic view of another embodiment of an isolation disconnect assembly with a movable conductor in a second position.

In another embodiment, shown in FIGS. 5-6, the line conductor assembly 90 elements are disposed in series. That is, the stationary conductor 92 is directly coupled to, and in electrical communication with, the fuse 96. Further, the fuse 96 is directly coupled to, and in electrical communication with, the line conductor assembly clinch joint clevis 94. Further, in this embodiment, when the movable conductor 102 is in the second position, the movable conductor 102 is coupled to, and in electrical communication with, the clinch joint clevis 94. In this embodiment, unlike the prior embodiment, the clinch joint 62 is structured to resist the blow open force generated during a short circuit event. That is, when a short circuit event at the second tripping current occurs, the fuse 96 interrupts the current prior to the clinch joint magnetic actuator 70 moving the movable conductor 102 out of the clinch joint clevis 94. Thus, when the clinch joint magnetic actuator 70 moves the movable conductor 102 out of the clinch joint clevis 94, there is no current passing through the isolation disconnect assembly conductor assembly 60 and no arc will form.

Stated alternately, in this embodiment, the movable conductor 102 only moves to the first position when actuated by the clinch joint magnetic actuator 70. In this configuration, the clinch joint magnetic actuator 70 is structured to, and does, reduce arcs between the clinch joint clevis 94 and the movable conductor 102. That is, in this embodiment, the clinch joint magnetic actuator 70 is structured to, and does, maintain the movable conductor 102 in the second position during a short circuit event wherein the current is at the first tripping current, and the clinch joint magnetic actuator 70 is structured to move the movable conductor 102 to the first position after the fuse 96 interrupts the current during a short circuit event at the second tripping current.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof

What is claimed is:

1. An isolation disconnect assembly for a power electronic switching device, said power electronic device including an insulated gate bipolar transistor assembly, said insulated gate bipolar transistor assembly including a conductor assembly, said insulated gate bipolar transistor assembly conductor assembly including a line conductor, said insulated gate bipolar transistor assembly having a first tripping current, said isolation disconnect assembly comprising:
   an isolation disconnect conductor assembly including a line conductor assembly, a load conductor assembly, and a clinch joint;
   said line conductor assembly including a stationary conductor, a clinch joint clevis and a fuse;
   said load conductor assembly including a movable conductor;
   a clinch joint magnetic actuator;
   said clinch joint magnetic actuator operatively coupled to said load conductor assembly movable conductor and structured to move said load conductor assembly movable conductor between an open, first position, wherein said load conductor assembly movable conductor is not in electrical communication with said line conductor assembly stationary conductor, and, a closed second position, wherein said load conductor assembly movable conductor is in electrical communication with said line conductor assembly stationary conductor;
   a control assembly, said control assembly in operative communication with said clinch joint magnetic actuator; and
   wherein said control assembly is structured to operatively communicate with said clinch joint magnetic actuator upon detection of a second tripping current, and wherein, said second tripping current is higher than said first tripping current, and
   wherein said isolation disconnect conductor assembly is structured to be coupled to, and in electrical communication with, said insulated gate bipolar transistor assembly conductor assembly.

2. The isolation disconnect assembly of claim 1 wherein said second tripping current is slightly higher than said first tripping current.

3. The isolation disconnect assembly of claim 1 wherein said line conductor assembly fuse has a fusing speed of between about 0.5 ms and about 1.5 ms.

4. The isolation disconnect assembly of claim 1 wherein:
   when said line conductor assembly includes a first current path and a second current path;
   said first current path including a stationary contact and said stationary conductor;
   said second current path including a secondary stationary conductor and said clinch joint and said fuse;
   said load conductor assembly movable conductor movable between an operating second position, wherein said load conductor assembly movable conductor is directly coupled to said stationary contact and wherein current passes through said first current path, and, a disconnect second position, wherein said load conductor assembly movable conductor is directly coupled to clinch joint and wherein current passes through said second current path; and
   wherein, said load conductor assembly movable conductor is structured to be in said operating second position during normal operation, and, to be in said disconnect second position during a short circuit event.

5. The isolation disconnect assembly of claim 4 wherein:
   said clinch joint magnetic actuator is structured to independently move said load conductor assembly movable conductor between said first position and said operating second position; and
   said load conductor assembly movable conductor is structured to be moved into said disconnect second position by magnetic force and said clinch joint magnetic actuator.

6. The isolation disconnect assembly of claim 5 wherein said load conductor assembly movable conductor includes a blow open cam.

7. The isolation disconnect assembly of claim 1 wherein:
   said line conductor assembly stationary conductor is directly coupled to, and in electrical communication with, said line conductor assembly fuse; and
   said line conductor assembly fuse is directly coupled to, and in electrical communication with, said line conductor assembly clinch joint clevis.

8. The isolation disconnect assembly of claim 7 wherein said line conductor assembly clinch joint is structured to withstand a blow open force.

9. The isolation disconnect assembly of claim 8 wherein said clinch joint magnetic actuator is structured to reduce arcs between said line conductor assembly clinch joint clevis and said load conductor assembly movable conductor.

10. The isolation disconnect assembly of claim 8 wherein:
    said clinch joint magnetic actuator is structured to maintain said load conductor assembly movable conductor in said second position during a short circuit event wherein the current is at the first tripping current; and
    said clinch joint magnetic actuator is structured to move said load conductor assembly movable conductor to said first position after said fuse interrupts the current during a short circuit event at the second tripping current.

* * * * *